United States Patent
Khursheed et al.

(10) Patent No.: US 6,891,159 B2
(45) Date of Patent: May 10, 2005

(54) CONVERTING SCANNING ELECTRON MICROSCOPES

(75) Inventors: Anjam Khursheed, Kent Vale (SG); Thiam Leong Thong, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 10/610,345

(22) Filed: Jun. 30, 2003

(65) Prior Publication Data

US 2004/0079884 A1 Apr. 29, 2004

Related U.S. Application Data

(60) Provisional application No. 60/393,132, filed on Jul. 3, 2002.

(51) Int. Cl.[7] ............................. G01N 23/00; G21K 7/00
(52) U.S. Cl. ................. 250/310; 250/311; 250/442.11; 250/396 ML
(58) Field of Search ............................... 250/310, 311, 250/396 ML, 442.11

(56) References Cited

U.S. PATENT DOCUMENTS

| | | | | |
|---|---|---|---|---|
| 4,866,280 A | * | 9/1989 | Ohtaka | 250/442.11 |
| 5,446,722 A | * | 8/1995 | Kojima et al. | 369/266 |
| 5,563,415 A | * | 10/1996 | Crewe | 250/396 ML |
| 5,717,207 A | * | 2/1998 | Koguchi et al. | 250/311 |
| 5,981,947 A | * | 11/1999 | Nakasuji et al. | 250/310 |
| 6,512,228 B2 | * | 1/2003 | Todokoro et al. | 250/310 |
| 6,610,980 B2 | * | 8/2003 | Veneklasen et al. | 250/310 |

OTHER PUBLICATIONS

L. Reimer, "Scanning Electron microscopy", Physics of Image Formation and microanalysis, 2nd ed., (1998), p. 52, Springer.

L. Reimer, "Transmission Electron Microscopy", Physics of Image Formation and Microanalysis, 4th ed., (1997), Springer.

FEI Company, "XL–FEG/S FEG STEM in Materials Science", The Netherlands.

A. Khursheed et al., "An add–on secondary electron energy spectrometer for scanning electron microscopes", Rev. Sci. Instrum., (2001), vol. 72, No. 3, p. 1708–1714.

A. Khursheed, "KEOS—The Khursheed Electron–Optics Software", (1992), Singapore.

A. Khursheed et al., "A high–resolution mixed field immersion lens attachment for conventional scanning electron microscopes", Review of Sci. Instrum., vol. 73, Aug. 8, 2002.

J.E. Barth et al., "Addition of different contributions to the charged particle probe size", Optik, (1996), vol. 101, No. 3, p. 101–109.

\* cited by examiner

Primary Examiner—John R. Lee
Assistant Examiner—Paul M. Gurzo

(57) ABSTRACT

A device for converting a scanning electron microscope (SEM) to a scanning transmission electron microscope (STEM) is adapted to be mounted on a conventional SEM. The device has a casing mountable on the SEM and provides support for a specimen to be scanned by a beam of primary electrons exiting the objective lens of the SEM. The casing defines a pathway allowing transmission electrons that have passed through the specimen to be detected. The device may have a magnet mountable on the casing for generating a transverse magnetic field to deflect the transmission electrons within the casing. A magnetic lens may be mounted within the casing for focusing the beam of primary electrons onto the specimen. The secondary electron detector of the SEM may be used to detect secondary electrons emitted from a target excited by the transmitted electrons. Alternatively, an electron detector may be mounted within the casing for detecting the transmitted electrons.

20 Claims, 5 Drawing Sheets

CONVERTING SCANNING ELECTRON MICROSCOPES

CROSS REFERENCE TO RELATED APPLICATIONS

This application claims priority from U.S. provisional patent application Ser. No. 60/393,132, entitled "Add-on Transmission Attachment for Scanning Electron Microscopes," and filed Jul. 3, 2002, which is incorporated herein by reference.

FIELD OF THE INVENTION

The present invention relates generally to electron microscopes, and more particularly to converting scanning electron microscopes to scanning transmission electron microscopes.

BACKGROUND OF THE INVENTION

A scanning electron microscope (SEM) is a common type of electron microscope. In an SEM, an energetic primary beam of electrons is focused on to and scanned in a raster-like pattern over a specimen. The primary beam causes electrons to be emitted from the specimen and induces current in the specimen. By detecting the emitted electrons or the induced current, a high magnification (typically higher than 100,000) image of the specimen can be produced on, for example, a CRT screen. A conventional SEM is constructed to detect emitted electrons, and not transmission electrons. Emitted electrons include backscattered electrons, secondary electrons, auger electrons, and induced current.

Other types of electron microscopes detect transmission electrons, those that travel through the specimen. For example, a scanning transmission electron microscope (STEM), scans a primary electron beam over a specimen, as in a conventional SEM. Unlike in an SEM, however, an STEM detects the transmitted electrons that pass through the specimen to produce an image of the specimen. A STEM usually operates with higher primary beam energies and is used for thinner specimens, in comparison to a SEM. The primary beam energy is typically in the range of 1 to 30 keV for SEM and 80 to 120 keV for STEM.

Because transmitted electrons react less with the specimen than non-transmitted electrons, a much higher image resolution can be obtained by detecting transmitted electrons. For example, at the top energy of 30 keV, the image resolution for a SEM is typically limited to 2 to 3 nm. In comparison, the resolution limit for a STEM can be as low as 0.2 to 0.3 nm.

Further, a STEM can be used with an electron energy loss spectrometer placed below the specimen. For example, an EELS can be a magnetic prism spectrometer having two parallel magnetic sector plates for creating a transverse magnetic field in the path of transmitted electrons. Transmitted electrons having different energies will bend to different angles under the same magnetic field. Therefore, a STEM with an electron energy loss spectrometer can selectively detect either those transmitted electrons that have not lost energy in the specimen (producing so-called brightfield images) or those that have lost energies due to interactions with the specimen (producing so called darkfield images). A STEM equipped with an electron energy loss spectrometer thus enhances its ability to provide quantitative material analysis.

Generally, it is more expensive to build and operate a STEM than a SEM. It is sometimes desirable to convert a SEM into an STEM for imaging thin objects (e.g. less than 50 nm thick). A known approach of converting a SEM to a STEM is to simply place a specially designed electron detector below the specimen. However, separate detectors need to be used to detect brightfield and darkfield images. Further, the image resolution using this approach is limited by the aberrations of the SEM objective lens.

Thus, there is a need for a simple way to convert a conventional SEM to a STEM that has high image resolution and/or can obtain energy loss spectral information.

SUMMARY OF THE INVENTION

Exemplary of the present invention, a device is provided for converting a SEM to a STEM. The device is adapted to be mounted on a conventional SEM. The device has a casing mountable on a SEM and providing support for a specimen to be scanned by a beam of primary electrons exiting the objective lens of the SEM. The casing defines a pathway for allowing transmission electrons that have passed through the specimen to be detected. A magnetic lens may be mounted within the casing for focusing the beam of primary electrons onto the specimen. The device may have a magnet mountable on the casing for generating a transverse magnetic field to deflect the transmission electrons within the casing. The transmitted electrons may be deflected differently in dependence on their energies so that electron energy loss spectrum can be obtained. The secondary electron detector of the SEM may be used to detect secondary electrons emitted from a target excited by the transmitted electrons. Alternatively, an electron detector may be mounted within the casing for detecting the transmitted electrons.

In accordance with an aspect of the present invention, there is provided a device for converting a scanning electron microscope (SEM) to a scanning transmission electron microscope. The device includes a casing mountable on the SEM, and capable of supporting a specimen to be scanned by a beam of primary electrons exiting the objective lens of the SEM. The casing defines a pathway for allowing transmission electrons that have passed through the specimen to be detected. The device further includes a magnet mountable on the casing for generating a transverse magnetic field to deflect the transmission electrons within the casing.

In accordance with another aspect of the present invention, there is provided a device for converting a scanning electron microscope (SEM) to a scanning transmission electron microscope. The device includes a casing mountable on the SEM, and capable of supporting a specimen therein to be scanned by a beam of primary electrons exiting the objective lens of the SEM. The casing defines a pathway for allowing transmission electrons that have passed through the specimen to pass through the casing to be detected. The device further includes a magnetic lens within the casing for focusing the beam of primary electrons onto the specimen.

Other aspects, features and advantages of the invention will become apparent to those of ordinary skill in the art upon review of the following description of specific embodiments of the invention in conjunction with the accompanying figures.

BRIEF DESCRIPTION OF THE DRAWINGS

In the figures, which illustrate exemplary embodiments of the invention.

DETAILED DESCRIPTION

Figure 1:
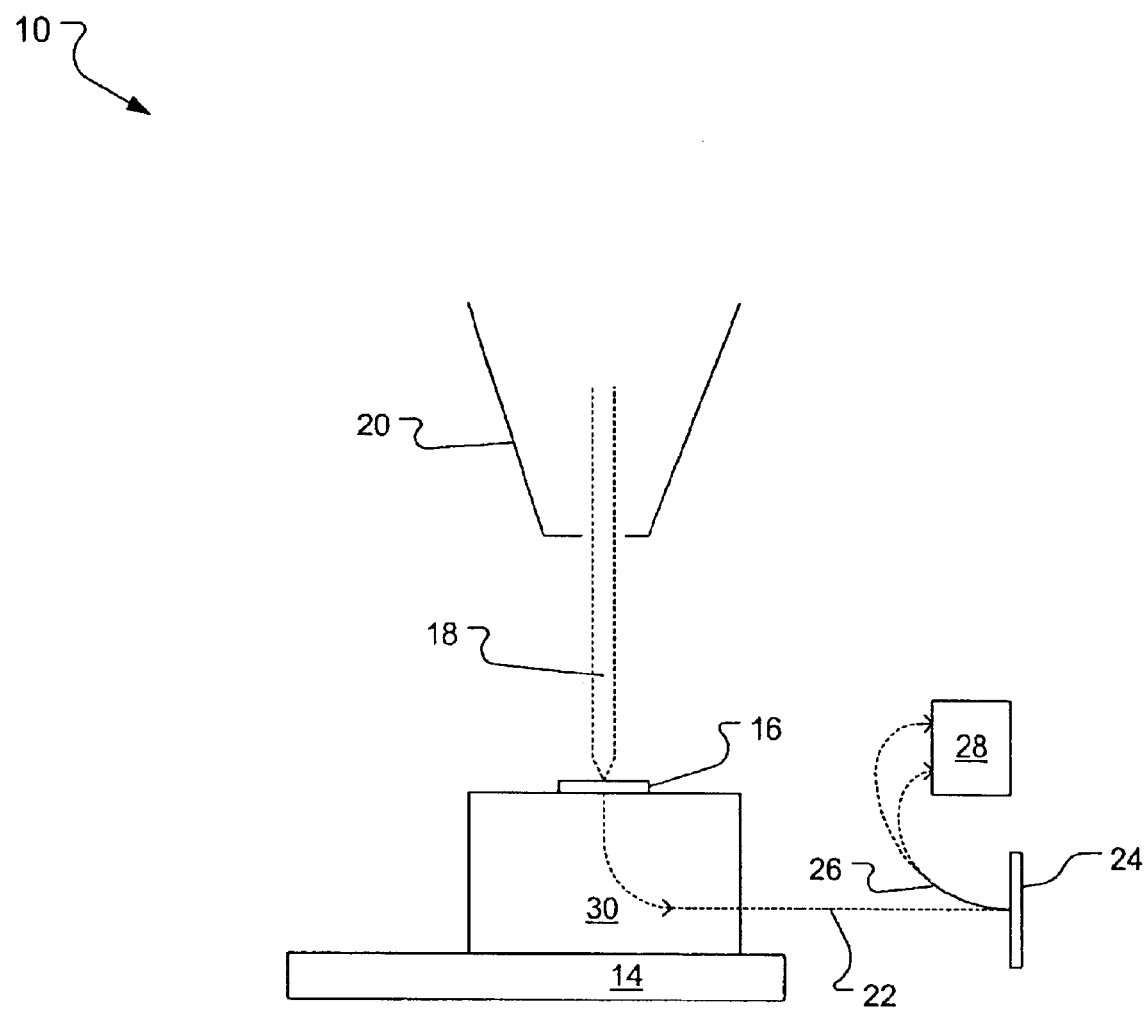
FIG. 1 is a schematic diagram illustrating a partial layout of an exemplary scanning electron microscope (SEM) operated in transmission mode.

FIG. 1 illustrates a conventional SEM 10 and a device 30 for converting SEM 10 to a STEM. As is typical, SEM 10 has a specimen stage 14 for placing a specimen 16; a primary electron beam source (not shown) for generating a primary electron beam 18; optics (not all shown except objective lens 20) for accelerating and focusing beam 18; and a secondary detector 28 for detecting emitted electrons.

Exemplary device 30 is adapted to be mounted on specimen stage 14 of SEM 10. Specimen 16 can be placed on top of (as shown) or inside (not shown) device 12. Device 12 defines a pathway allowing transmitted electrons 22 that have travelled through specimen 16 to travel through and be detected by a detector. An electron detector, such as secondary electron detector 28, can be used to detect transmitted electrons 22 indirectly by detecting secondary electrons 26 emitted from a target 24 excited by transmitted electrons 22. A ring electrode (not shown) may be placed around specimen 16, which may be biased to above 50 V for attracting secondary electrons emitted from specimen 16 and preventing them from reaching secondary electron detector 28. Of course, transmitted electrons 22 may also be detected directly if an electron detector is placed in the path of transmitted electrons 22.

Device 30 generates a transverse magnetic field in the path of transmitted electrons 22 that have passed through object 16 to alter their direction of travel. As can be appreciated, since the bending angles of transmitted electrons 22 in a magnetic field depend on their kinetic energies, it is possible to selectively detect these electrons thus obtaining information on the transmitted electron energy spectrum. Particularly, it is to switch between the darkfield mode and the brightfield mode, as transmitted electrons 22 emerging from device 30 may be limited to those having energies forming only a fraction of the transmitted electron energy spectrum. Detected energy ranges can be selected by changing the strength of the magnetic field.

Figure 2A:
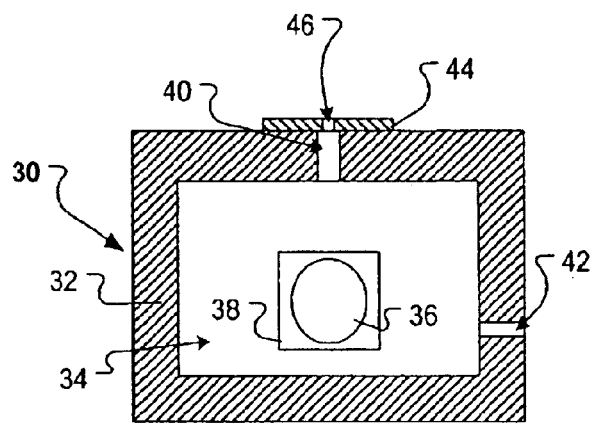
FIG. 2A is sectional view of an exemplary SEM attachment device, exemplary of an embodiment of the invention.
Figure 2B:
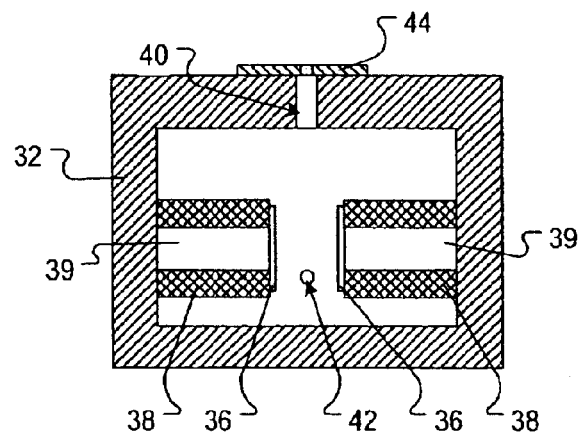
FIG. 2B is a sectional view of the device of FIG. 2A, in a plane normal to the plane of the sectional view of FIG. 2A.
Figure 2C:
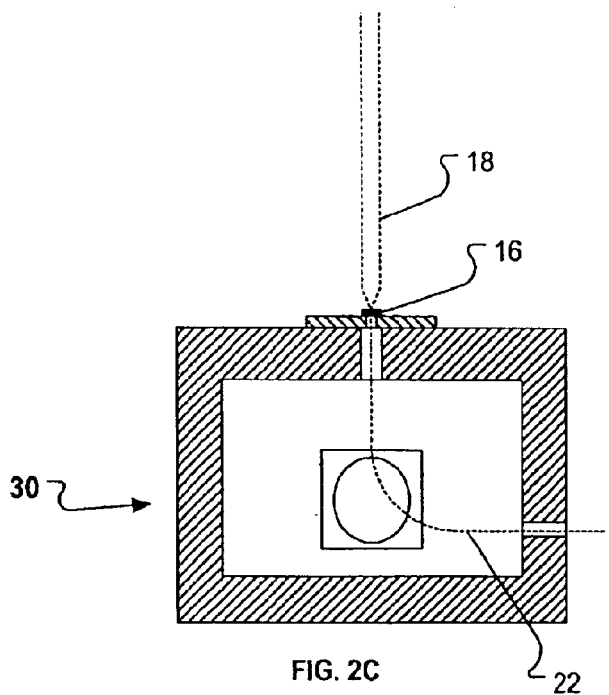
FIG. 2C is a sectional view illustrating the operation of the embodiment of FIGS. 2A–2B.

An exemplary device 30 is illustrated in cross-section in FIGS. 2A to 2C. Device 30 has a magnetic casing 32, constructed for example of iron or other suitable magnetic material. Casing 32 includes a transmission chamber 34 having an opening 40 on the top of casing 32, beneath a mount or support for a specimen 16 of interest. Transmitted electrons 22 from specimen 16 may thus travel through chamber 34 to target 24. A pair of magnets in the form of magnetic sector plates 36 is mounted inside transmission chamber 34 to casing 32 by solenoid bores 39. The two plates are parallel and face each another. Each of sector plates 36 can be energized by coils 38 around solenoid bore 39, also mounted inside chamber 34, to produce magnetic fields between the gap of sector plates 36 transverse to the travel direction of transmitted electrons 22. A controlled power supply (not shown) provides current through coils 38 to produce a desired magnetic field. Casing 32 further includes an exit opening 42 on its side. Exit opening 42 allows transmitted electrons 22 to exit transmission chamber 34. Exit opening 42 may be sufficiently narrow so that only transmitted electrons having kinetic energies in a particular range can pass through it at a time. Exit opening 42 is typically sub-millimeter in size, for example, in the range of 20 to 500 microns. Exit opening 42 may have various suitable shapes other than a circular shape as shown. Exit opening 42 may also be a motor driven slit or similar cover with adjustable size and location allowing opening 42 to be varied in size to select transmitted electrons that can be detected. Preferably, the slit can be adjusted externally.

A non-magnetic specimen holder 44 may be mounted on top of entry opening 40. Holder 44 has a bore 46 extending through it to allow transmitted electrons 22 to pass through.

Casing 32 may have a bottom adapted to be received by the specimen stage of SEM 10. As depicted in FIGS. 2A–2C, the bottom of casing 32 is flat and casing 32 can be simply placed on specimen stage of the SEM. Other shapes and constructions can also be used, for example, to securely mount casing 32 on specimen stage 14.

In operation, a sufficiently thin specimen 16 is placed on and held by specimen holder 44. Casing 32 is then placed on specimen stage 14 of SEM 10. Primary electron beam 18 is generated by SEM 10 and scanned over specimen 16. Objective lens 20 and casing 32 can be aligned using known techniques so that transmitted electrons 22 from specimen 16 can travel through bore 46 of specimen holder 44 and entry opening 40 of casing 32 and enter chamber 34. For example, alignment of device 30 with primary electron beam 18 can be carried out through normal specimen stage movement, where a secondary electron image of device 30 can be used to center device 30. During this initial step, the bias ring electrode around specimen 16 should not be biased with a positive voltage, thereby allowing secondary electrons emitted from specimen 16 to reach secondary electron detector 28.

Appropriate magnetic fields are generated between sector plates 36 as a result of energizing coils 38, so that transmitted electrons 22 change their direction of travel between sector plates 36 and are directed towards exit opening 42 to exit casing 32. For example, a field strength of 0.1 tesla between plates 36 may be required to bend a 30 keV beam around a radius of 5.8 mm.

When exit opening 42 is narrow, so as to only allow electrons having kinetic energies in a particular range to pass through at any given magnetic field, the field strength between sector plates 36 can be varied to sweep transmitted electrons 22 across exit opening 42. Hence, conveniently, electron energy loss spectral information can be obtained.

Transmission electrons exiting opening 42 are directed to a region of SEM 10 that allows the secondary detector of SEM 10 (e.g. detector 28 of FIG. 1) to detect secondary emissions resulting from the transmission electrons. Conveniently, no new detectors need to be included in device 30 as transmitted electrons 22 can be detected indirectly using an existing secondary electron detector of SEM 10. Advantageously, device 30 can be made compact and at low cost. It is also easy to install and operate.

Figure 3:
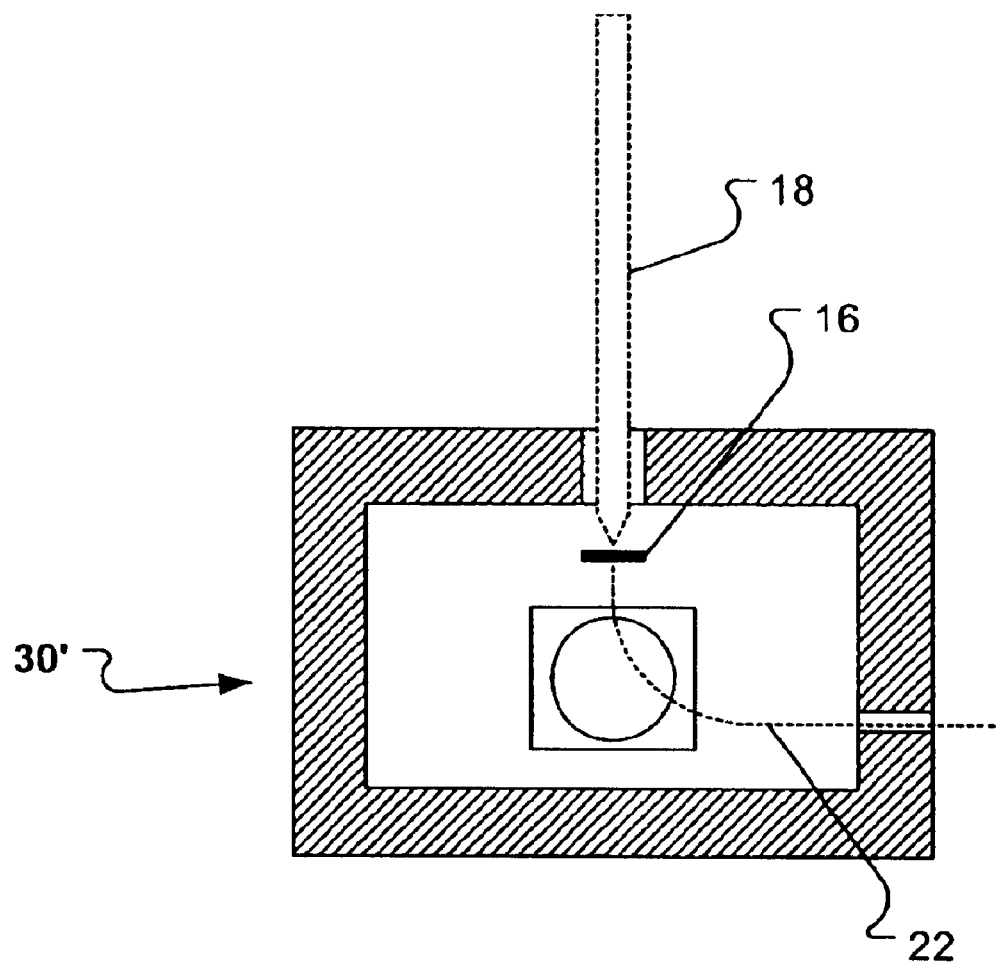
FIG. 3 is a sectional view of an exemplary SEM attachment device, exemplary of another embodiment of the invention.

As can be appreciated, many modifications can be made to device 30 illustrated in FIGS. 2A to 2C. For example, transmitted electrons 22 may be bend to an angle more or less than 90 degrees and correspondingly exit opening 42 can be higher or lower than depicted in FIGS. 2A to 2C. Instead of placing specimen 16 on top of casing 32, specimen 16 may be retained inside chamber 34 of casing 32 above sector plates 36. A device 30' including an internal mount for specimen 16 is illustrated in FIG. 3. Further, an exemplary device 30" may include a magnetic lens for focusing primary electron beam 18 on to specimen 16 to improve image resolution, as for example illustrated in FIG. 4.

Figure 4:
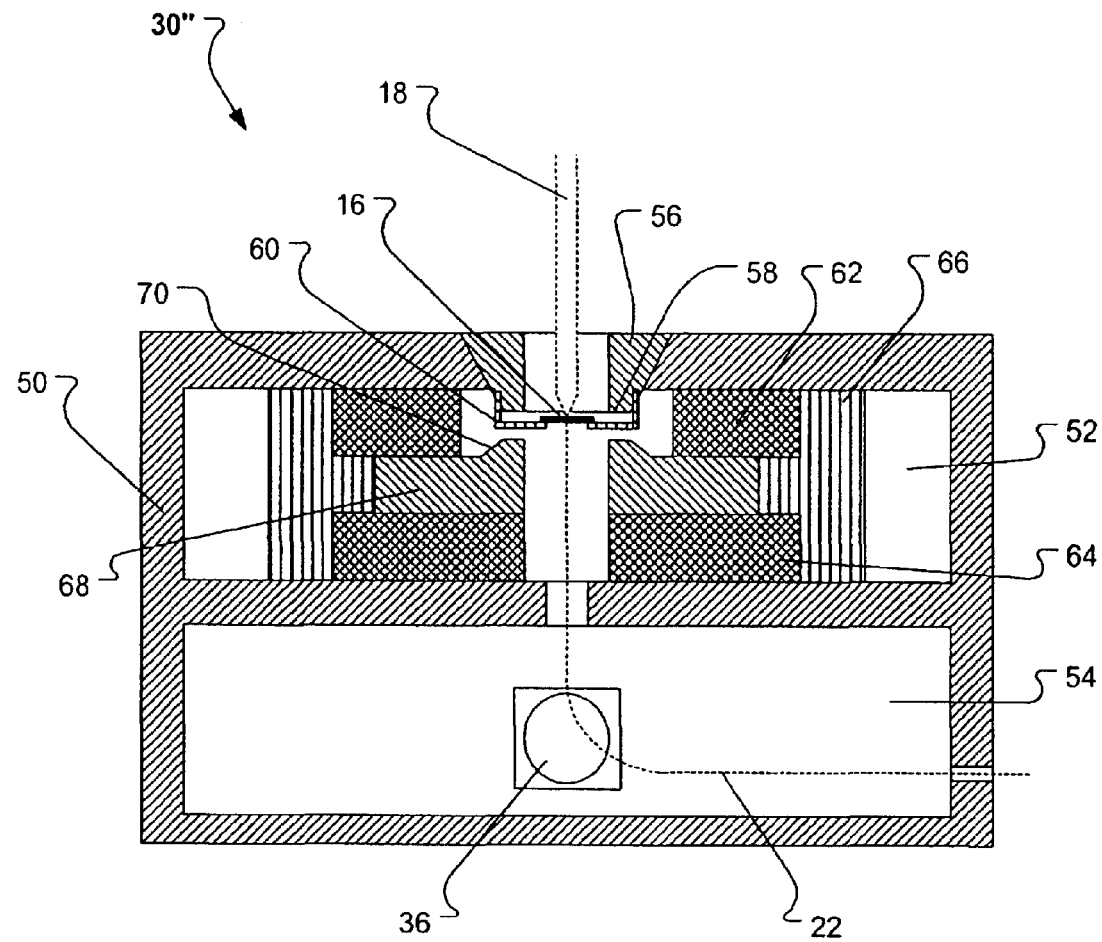
FIG. 4 is a sectional view of an exemplary SEM attachment device, exemplary of another embodiment of the invention.

As illustrated in FIG. 4, device 30" includes a casing 50, having two chambers: a focusing chamber 52 and a transmission chamber 54. Transmission chamber 54 may be constructed similarly as transmission chamber 34 of device 30 (FIGS. 2A–2B).

Device 30" further includes additional focusing chamber 52. As illustrated, a detachable circular plug 56 can be plugged into a top opening of focusing chamber 52. Plug 56 is magnetic and may be made of the same material as casing 50. Exemplary plug 56 is generally cone-shaped with a tapered generally circular outline and a bore extending between its top and lower end. Other shapes may be used. For example, instead of tapered, the outline may be stepped. Plug 56 has a tip 58, which functions as a pole piece of a magnetic lens, as will become clear from the description below.

A non-magnetic specimen holder 60 is attached to plug 56. Holder 60 includes a holding plate for holding specimen and can have various shapes. Any suitable attachment mechanism may be used for attaching holder 60 to plug 56. Holder 60 may also be attached directly to casing 50. Attaching holder 60 to plug 56, however, makes it easy to insert or replace specimen on holder 60 into focusing chamber 52. Specimen 16 can be placed into focusing chamber 52 (or replaced) by simply lifting up and lowering down plug 56 with holder 60 attached.

Two ring-shaped magnets, upper magnet 62 and lower magnet 64, are mounted inside top chamber 52. High grade Neodymium-Iron-Boron (NbFeB) permanent magnets may be used. Magnets 62 and 64 provide the magnetic fields for additional focusing of the primary electron beam 18. In the illustrated embodiment, the coercive forces of the two magnets 62 and 64 oppose one another in the vertical direction. An aluminum guide 66 may hold permanent magnets 62 and 64 in place.

A field guiding spacer 68 may be provided for guiding the magnetic flux. Field guiding spacer 68 can be a generally ring-shaped iron plate sandwiched between upper magnet 62 and lower magnet 64. The iron plate may have a tapered center portion 70 for concentrating the flux at the gap between the tapered portion 70 and tip 58 of plug 56. As can be appreciated, tapered portion 70 also functions as a pole piece of the magnetic lens. The magnet flux generated in focusing chamber 52 flow through iron casing 50, iron plate 68, plug 56 and the gap between plug 56 and field guiding spacer 68. The shapes and dimensions of tip 58 and tapered portion 70 may be designed according to known immersion magnetic lens design principles. For example, the gap between tip 58 and tapered portion 70 may be small, such as a few millimeters high. When the gap is small, magnetic flux between the gap are substantially parallel to the beam axis of primary electron beam 18.

Device 30" can be constructed with an overall height of 35 to 40 mm. Numerical simulations predict that the magnetic lens of device 30" can have a focal length of less than 1 mm with primary beam energy of 30 keV.

Conveniently, as device 30" is compact in size, it can be easily fit between specimen stage 14 and objective lens 20 of SEM 10.

Advantageously, device 30" can be used to improve the image resolution of a conventional SEM by about an order of magnitude, making it similar in resolution performance to dedicated STEM systems.

As may be appreciated, modifications to device 30" are possible. For example, focusing chamber 52 and transmission chamber 54 may be housed by two separate casings stacked together or even displaced by a distance.

Figure 5:
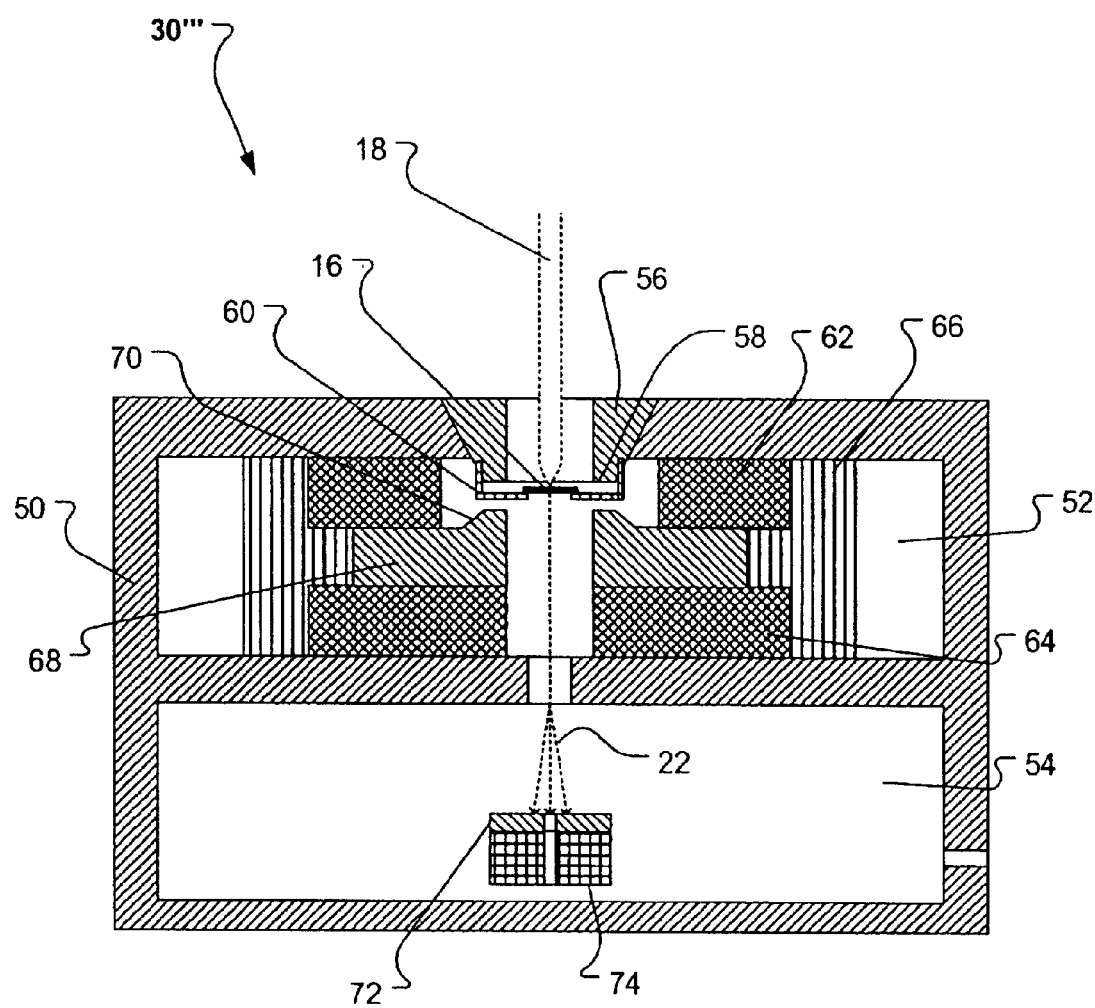
FIG. 5 is a sectional view of an exemplary SEM attachment device, exemplary of another embodiment of the invention.

FIG. 5 illustrates another exemplary embodiment of the invention, device 30'" for converting a SEM to a STEM. Device 30'" is similar to device 30" but an internal electron detector 72 is mounted inside transmission chamber 54. Detector 72 is placed below specimen 16 and can be used for forming the image of specimen 16. Detector 72 may be annular in shape and supported by detector holder 74. If it has an annular shape, electron detector 72 can be positioned to only detect off-axis transmitted electrons 22, and can thus be used to obtain the darkfield image. Detector 72 may also be moved to directly detect on-axis electrons which have zero energy loss, to obtain the brightfield image. Optional magnets, similar to bending magnets 36 of FIGS. 2A–2C may allow an energy spectrum for the transmission electrons to be obtained. However, with device 30'", high resolution transmitted image can be obtained directly without reliance on secondary electron detector 28 of SEM 10.

Other features, benefits and advantages of the present invention not expressly mentioned above can be understood from this description and the accompanying drawings by those skilled in the art.

Although only a few exemplary embodiments of this invention have been described above, those skilled in the art will readily appreciate that many modifications are possible therein without materially departing from the novel teachings and advantages of this invention.

The invention, rather, is intended to encompass all such modification within its scope, as defined by the claims.

What is claimed is:

1. A device for converting a scanning electron microscope (SEM) to a scanning transmission electron microscope, comprising:
    a casing mountable on said SEM, and capable of supporting a specimen to be scanned by a beam of primary electrons exiting the objective lens of said SEM, said casing defining a pathway for allowing transmission electrons that have passed through said specimen to be detected;
    a magnet mountable on said casing for generating a transverse magnetic field to deflect said transmission electrons within said casing.

2. The device of claim 1, comprising an electron detector for detecting said transmission electrons.

3. The device of claim 1, wherein said casing is capable of supporting said specimen therein, and further comprising a magnetic lens within said casing for focusing said beam of primary electrons onto said specimen.

4. The device of claim 1, wherein said casing has an exit opening for allowing said transmission electrons to exit said casing so that said transmission electrons can be detected by a detector external to said casing.

5. The device of claim 4, wherein said exit opening is positioned to allow said transmission electrons to be detected by a secondary electron detector of said SEM.

6. The device of claim 4, wherein said exit opening is positioned to direct said transmission electrons towards a target in sufficient proximity to a secondary electron detector of said SEM, to allow said secondary electron detector to detect said transmission electrons indirectly by detecting secondary electrons excited by said transmission electrons and emitted from said target.

7. The device of claim 4, wherein said exit opening is sufficiently narrow to only allow transmission electrons of a particular range of kinetic energies to exit said casing.

8. The device of claim 7, wherein said magnetic field is variable so that said particular range is variable.

9. The device of claim 1, wherein said magnet comprises a pair of parallel magnetic plates facing each other from a distance such that said transmission electrons travel through the gap between said parallel magnetic plates.

10. The device of claim 1, further comprising at least one magnetic coil for energizing said magnet.

11. The device of claim 1, wherein said casing is made of a magnetic material.

12. The device of claim 11, wherein said magnetic material comprises iron.

13. A device for converting a scanning electron microscope (SEM) to a scanning transmission electron microscope, comprising:

a casing mountable on said SEM, and capable of supporting a specimen therein to be scanned by a beam of primary electrons exiting the objective lens of said SEM, said casing defining a pathway for allowing transmission electrons that have passed through said specimen to pass through said casing and be detected;

a magnetic lens within said casing for focusing said beam of primary electrons onto said specimen.

14. The device of claim 13, wherein said casing comprises an opening for receiving said beam, and further comprising a plug receivable in said opening, said plug comprising a holding plate for supporting said specimen.

15. The device of claim 14, wherein said casing is made of a magnetic material.

16. The device of claim 14, wherein said magnetic lens comprises upper and lower ring shaped magnets.

17. The device of claim 16, wherein said magnetic lens comprises a field guiding spacer sandwiched between said upper and lower ring shaped magnets.

18. The device of claim 17, wherein one of said casing and said plug comprises a tapered section around said opening forming a pole piece of said magnetic lens, and said field guiding spacer comprises a tapered section forming a pole piece of said magnetic lens opposite said tapered section of said one of said casing and said plug.

19. The device of claim 13, further comprising an electron detector for detecting said transmission electrons.

20. The device of claim 19, wherein said electron detector is annular in shape.

* * * * *